United States Patent [19]

Dornes et al.

[11] Patent Number: 4,590,673
[45] Date of Patent: May 27, 1986

[54] FORCE-FITTING COMPONENTS INTO A WORKPIECE

[75] Inventors: Bryan J. Dornes, Hershey; Jon F. Kautz, Camp Hill; Edward J. Paukovits, Jr., Hummelstown; Richard V. Spong, Etters; Robert J. Talarico, Camp Hill; Harry G. Prescott, Hershey, all of Pa.

[73] Assignee: AMP Incorporated, Harrisburg, Pa.

[21] Appl. No.: 618,983

[22] Filed: Jun. 11, 1984

[51] Int. Cl.$^4$ .................. H05K 3/00; B23P 19/00
[52] U.S. Cl. ..................... 29/845; 29/747; 29/739
[58] Field of Search ............ 29/842, 845, 739, 742, 29/744, 833, 834; 227/701, 113

[56] References Cited

U.S. PATENT DOCUMENTS

| | | |
|---|---|---|
| 3,286,740 | 11/1966 | Fuch, Jr. et al. ............ 140/7 X |
| 4,089,104 | 5/1978 | Barry et al. ............ 29/739 X |
| 4,102,043 | 7/1978 | Andrade et al. ............ 29/739 |
| 4,367,583 | 1/1983 | Baccei ............ 29/747 X |

Primary Examiner—Howard N. Goldberg
Assistant Examiner—Carl J. Arbes
Attorney, Agent, or Firm—Jay L. Seitchik

[57] ABSTRACT

A plurality of components are force-fitted into a workpiece simultaneously, by the following steps: preparing a dummy workpiece with tool supports fixed thereto in a predetermined pattern, each tool support being removably surmounted by a component insertion tool; placing the dummy workpiece beneath a magnetic chuck on the platen of a hyrdraulic press; lowering the platen so that the tools are magnetically secured to the chuck; raising the platen to remove the tools from the tool supports; replacing the dummy workpiece by an actual workpiece with the components arranged thereon in said predetermined pattern; lowering the platen so that each tool on the chuck force-fits the component therebeneath into the workpiece; raising the platen with the tools thereon; and removing the actual workpiece from the press.

10 Claims, 13 Drawing Figures

FORCE-FITTING COMPONENTS INTO A WORKPIECE

This invention relates to a method of force-fitting components, especially electrical components, into a workpiece which may be, for example, a circuit board or other substrate. The invention also relates to a hydraulic press which is specifically adapted for carrying out the method.

Some electrical components may comprise pins for insertion into the workpiece. A pin, which is particularly useful for this purpose, and which is retained in the workpiece against substantial pulling forces, comprises a split enlarged mounting portion which is oversized with respect to the hole in the workpiece into which the pin is to be force-fitted, the two parts of the split mounting portion frictionally engaging one another as the pin is force-fitted into the hole. Such a pin, which is described in U.S. Pat. No. 4,186,982, may require an insertion force of some 50 pounds in order to fit it into the hole. Where, as sometimes may be the case, the component comprises a plurality of such pins, for example, ten, the total insertion force will amount to a multiple of the force required to insert each pin of the component. Thus, the force required to insert a component comprising ten such pins can amount to about 500 pounds.

The present invention is directed to the problem of force-fitting a substantial number of components simultaneously into a workpiece, whilst allowing for the arrangement of, and the nature of, the components to be force-fitted into the workpiece to be rapidly and easily modified, that is to say for the tooling used for the force-fitting operation to be rapidly and easily set up for the production of different end products.

According to one aspect of the invention, a method of force-fitting components into a workpiece comprises the steps of: locating in alignment with a magnetic chuck on a press platen, a dummy workpiece having tool supports fixed thereto in a predetermined array with predetermined spacing therebetween and with a component insertion tool removably surmounting each tool support; moving the platen towards the workpiece to secure each tool magnetically to the chuck; withdrawing the platen thereby to remove each tool from the support surmounted thereby; replacing the dummy workpiece by an actual workpiece with components arranged thereon in said predetermined array and with said predetermined spacing therebetween; and moving the platen with the tools thereon towards the dummy workpiece to cause each tool on the chuck to force-fit the corresponding component into the actual workpiece.

A new dummy workpiece can be prepared each time the arrangement of, or the nature of, the components on the workpiece is to be modified. The labor and expense of mounting fresh permanent tooling to the platen is thereby avoided.

The components may, for example, be electrical connectors, into the housings of which the tools are arranged to penetrate in order to drive pins extending from electrical terminals in the housings, into the workpiece, said tool supports being identical electrical connectors.

Each tool may comprise a plurality of insertion plates each dimensioned to engage an individual electrical terminal.

According to another aspect of the invention, a hydraulic press suitable for carrying out the method described above comprises a base; a press platen; a chuck on the platen; a flat, magnetic, tool supporting surface on the chuck; a worktable slidably mounted on the base; a flat, workpiece supporting surface on the worktable; means supporting the platen for reciprocating movement towards and away from the base with said tool supporting surface and said workpiece supporting surface in parallel relationship; a hydraulic ram for driving the platen through a working stroke towards the base and a return stroke away therefrom; means for driving the worktable between a work station at which said workpiece supporting surface faces said platen and a loading station laterally displaced from the platen; and means for automatically laterally aligning said workpiece supporting surface with said tool supporting surface during the working stroke of the platen when the worktable is at the work station position.

Conveniently, the worktable aligning means may be in the form spring loaded pins on the platen, having tapered free ends which engage in openings in the worktable.

In use of the press, the worktable is first moved to its loading position, the dummy workpiece is placed on the worktable after which the worktable is moved to its working position, the ram is moved through a working and return stroke to pick up the tools from the tool supports on the dummy workpiece, the worktable is returned to its loading position, the dummy workpiece is removed from the worktable, the actual workpiece is placed on the worktable, the worktable is returned to its working position, and the ram is moved through a working stroke to force-fit the components thereon into the actual workpiece, the ram is moved through a return stroke, the worktable is again returned to its loading position, and the actual workpiece is removed therefrom.

Means may be provided for automatically actuating the ram when the worktable has been moved to its working position, so that the ram carries out a working and return stroke and means may also be provided for detecting the presence of connectors on the actual workpiece, which are of excessive height.

For a better understanding of the invention, an embodiment thereof will now be described by way of example with reference to the accompanying drawings in which.

Figure 1:
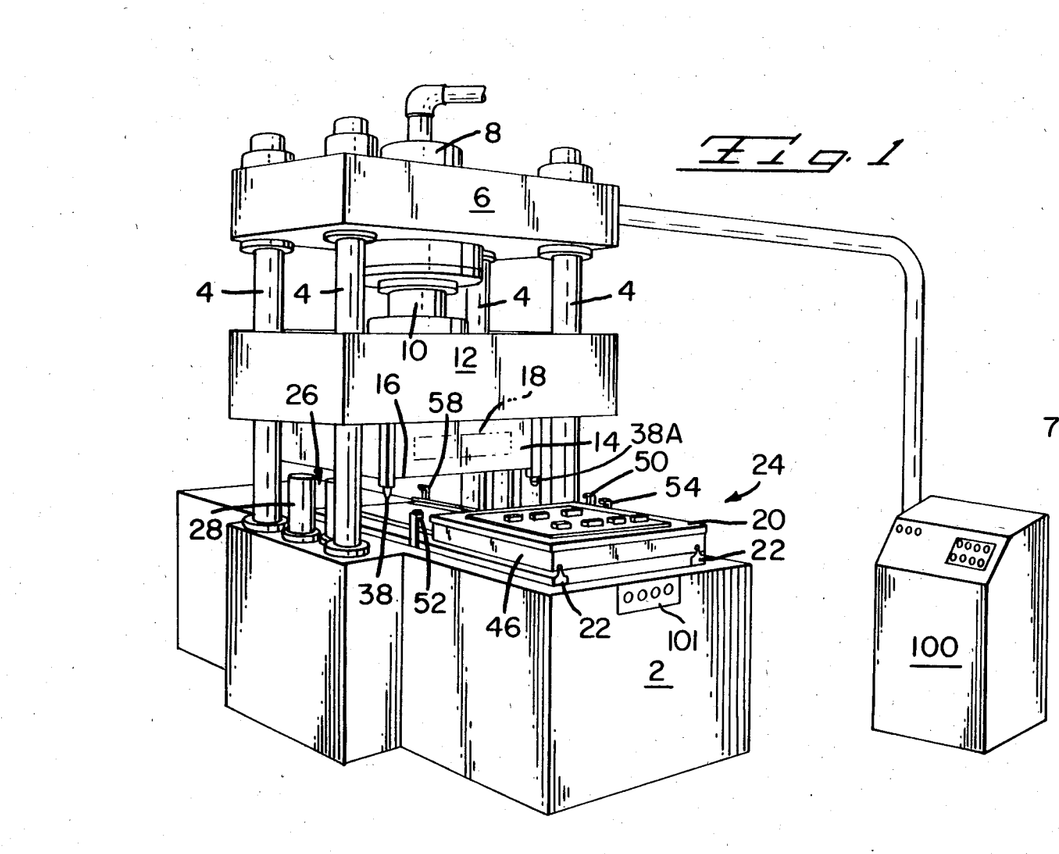
FIG. 1 is a perspective view of a hydraulic press for force-fitting electrical posts projecting from a plurality of electrical connectors simultaneously into holes in a circuit board.
Figure 2:
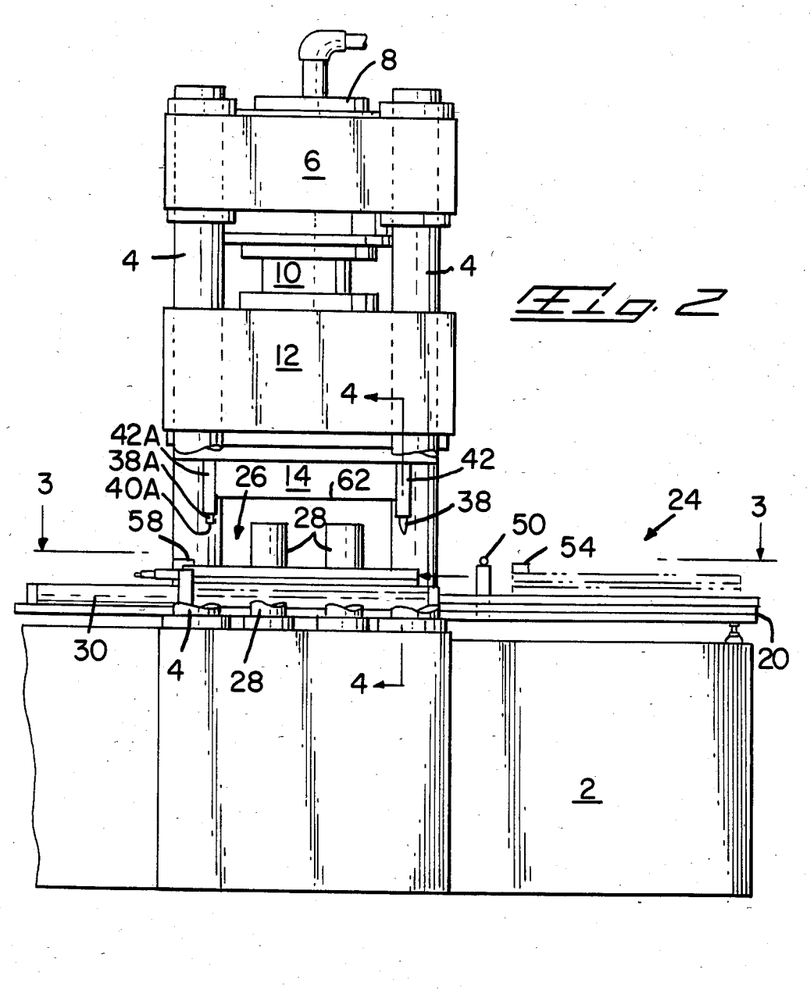
FIG. 2 is a side view of the press.
Figure 3:
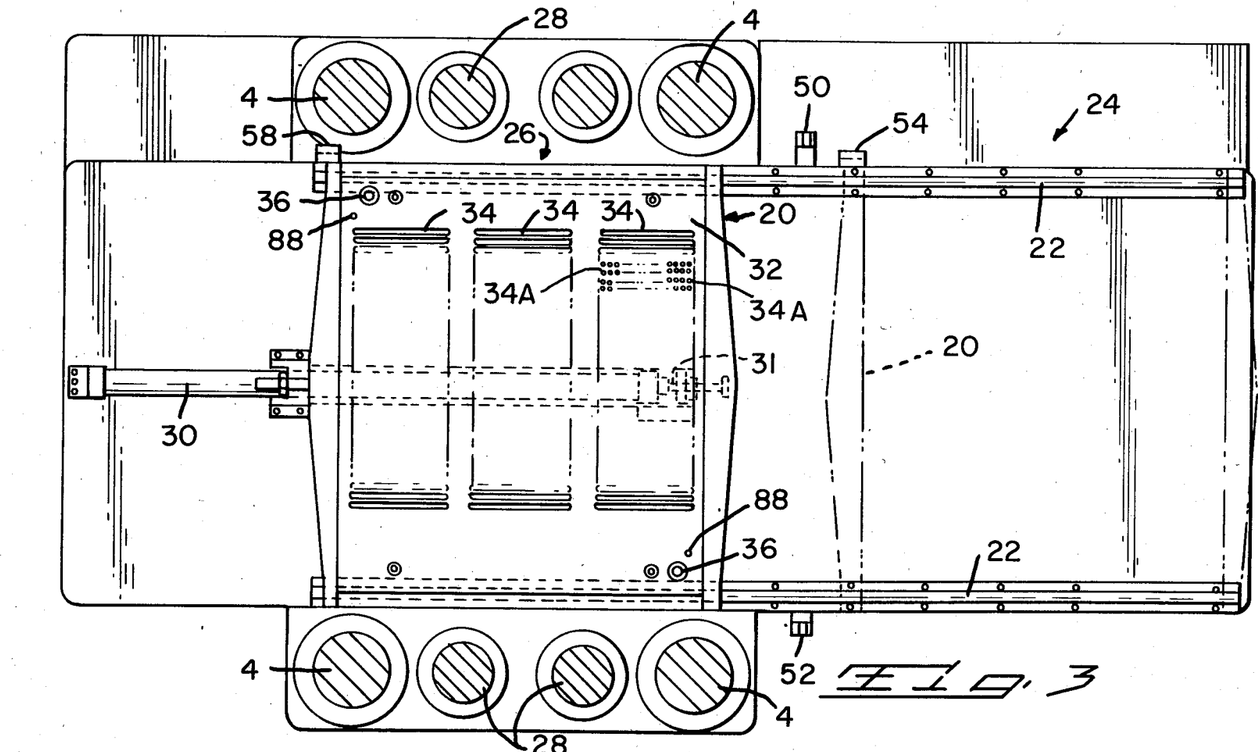
FIGS. 3 and 4 are views taken on the lines 3—3 and 4—4 respectively, of FIG. 2.

As shown in FIGS. 1 to 3, the press comprises a base 2, from which upstand columns 4, supporting a head plate 6, which in turn supports a double-acting hydraulic piston and cylinder unit 8. The unit 8 has a piston rod 10 secured to a press platen 12 which is guided for vertical reciprocating movement along the columns 4. On the platen 12 is a magnetic chuck 14, which is in the form of a permanent electromagnet having a flat tool supporting surface 16. The chuck 14 can be magnetized or demagnetized as required by means of an electro magnetic coil 18 which is shown diagrammatically in FIG. 1. A worktable in the form of a shuttle 20 is slidable on parallel rails 22 which extend along the base 2, between a loading station 24 on one side of the chuck 14 and a work station 26 beneath the chuck 14. The working stroke of the platen 12 is limited by stops 28 on the base 2.

Figure 4:
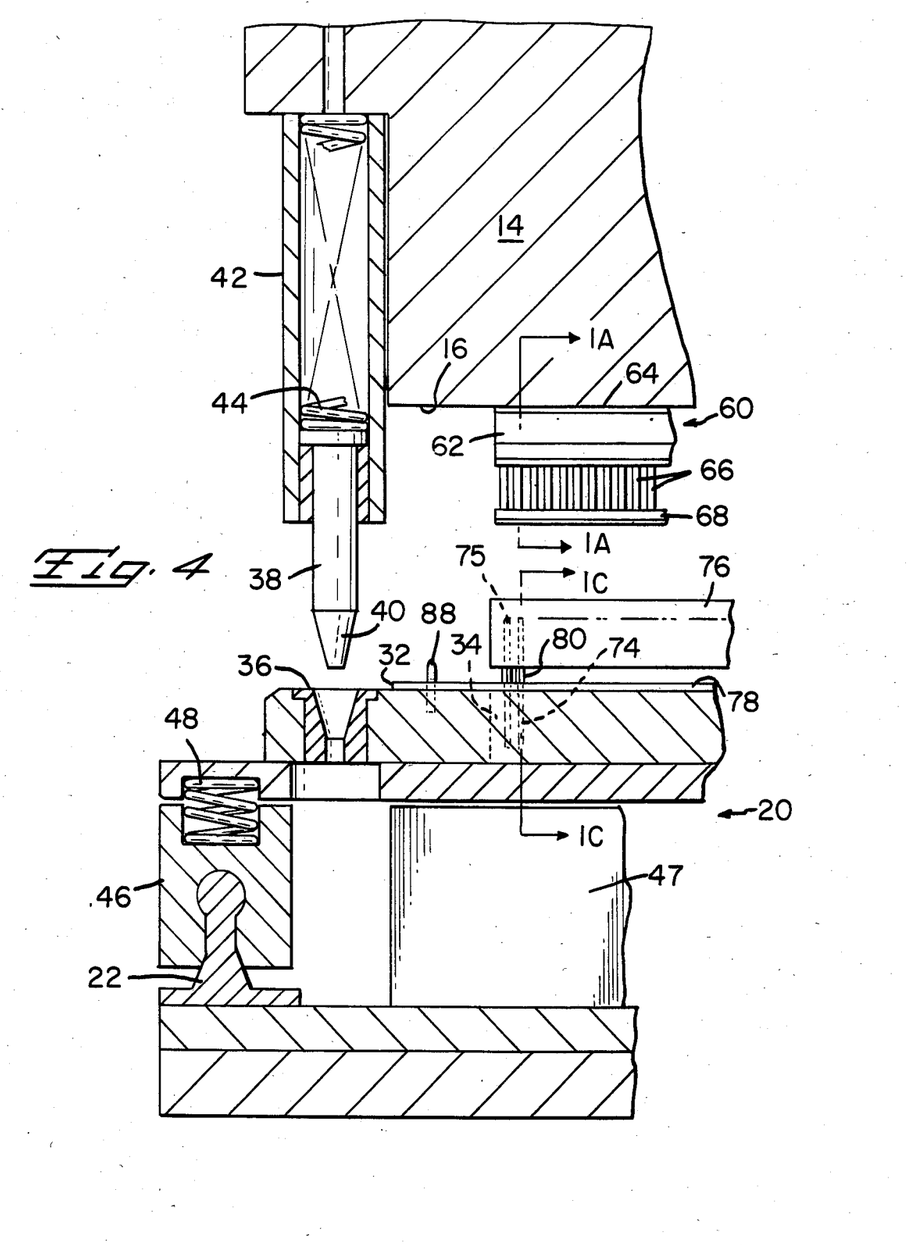

The shuttle 20 is driven between the stations 24 and 26 by a pneumatic piston and cylinder unit 30 (FIG. 3) having a piston rod 31. The shuttle 20 has a flat workpiece supporting surface 32 parallel to the surface 16 of the chuck 14. In the surface 32 are pin receiving slots 34 or holes 34A and internally metal-clad tapered alignment holes 36, at diagonally opposite corners of the surface 32, for cooperation with alignment pins 38 on corresponding corners of the chuck 14 which have tapered free ends 40. On the remaining corners of the chuck 14 are pins 38A terminating in flats 40A. As best seen in FIG. 4, each pin 38 is mounted in a cylinder 42 secured to the chuck 14 and is slidable inwardly of the cylinder 42 against the action of a spring 44. The pins 38A are mounted in cylinders 42A and are similarly slidable against the action of springs, not shown, therein. The shuttle 20 comprises blocks 46 (one of which is shown in FIG. 4) loaded by springs 48 and receiving the rails 22. Beneath the shuttle (when it is positioned at the station 26) is an auxilliary bolster 47. Between the stations 24 and 26 and beside the rails 22, are mounted, at a predetermined level above the surface 32 of the shuttle 20, a photoelectric cell 50 and a cooperating light source 52. Vane limit switches 54 and 58 are mounted at the entrance to the station 26 and at the leftward (as seen in FIG. 3) limit of the station 24, respectively.

Figure 1A:
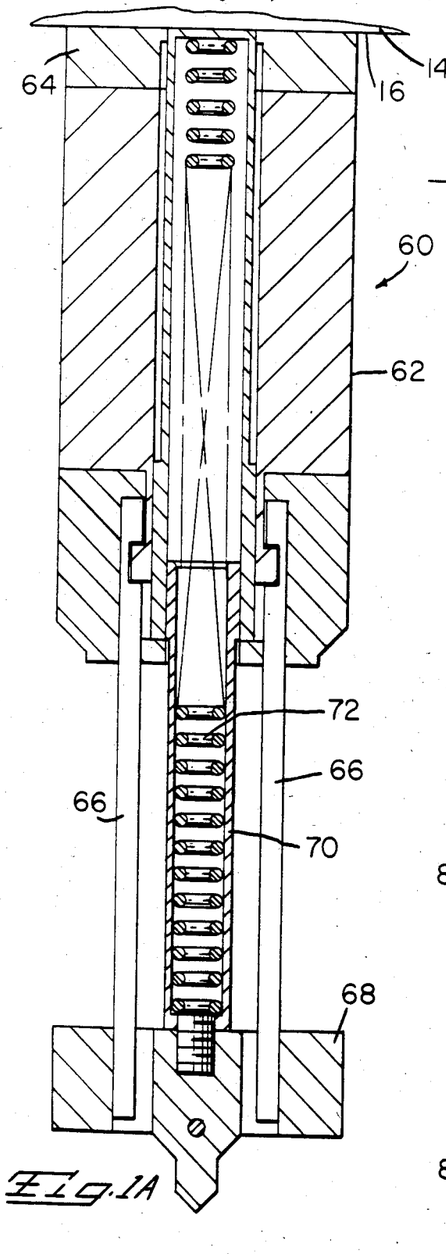
FIGS. 1A to 1C are enlarged views taken on the lines 1A—1A in FIG. 4, 1B—1B in FIG. 5, and 1C—1C in FIG. 4, respectively.
Figure 1B:
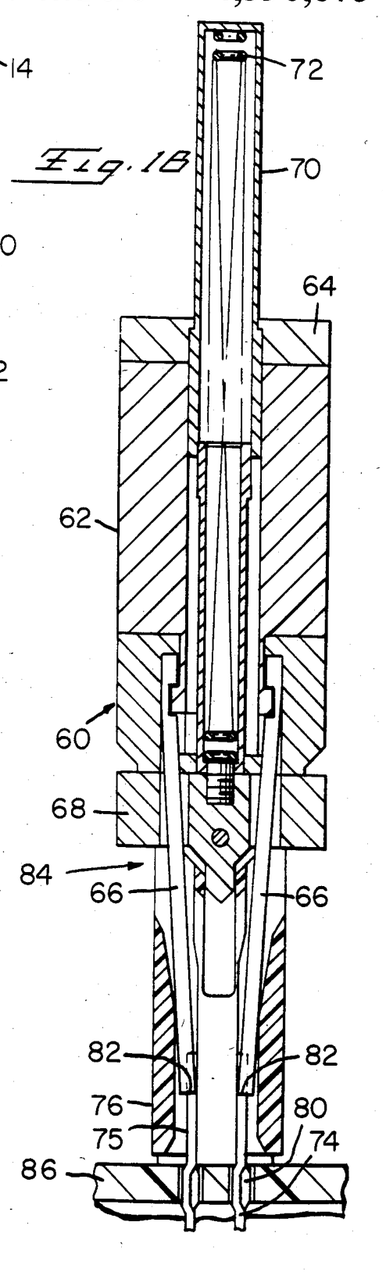

The press tooling comprises terminal insertion tools 60 (FIGS. 1A, 1B and 4), which are described in detail in a copending, companion, U.S. patent application Ser. No. 618,982, filed 6/11/84. Briefly stated, each tool 60 comprises a body 62, surmounted by a steel plate 64, and in which are rigidly fixed depending electrical terminal insertion fingers in the form of plates 66. Extending about the plates 66 is a guide means in the form of a slide 68 mounted on tube means in the form of hollow rods 70 which are slidable bores in the body 62 and plate 64 and contain spring 72. The slide 68 can be moved along the plates 66 from its position of FIG. 1A until it engages the body 62 (FIG. 1B) when the tools dismounted from the chuck 14, the rods 70 projecting upwardly from the body 62 as shown in FIG. 1B.

According to the present example, the press is used for force-fitting pins 74 (FIG. 1B) of electrical connectors 76 into holes in a circuit board 78 (FIG. 4), these pins 74 having enlarged mounting portions 80 according to U.S. Pat. No. 4,186,982, referred to above, which is incorporated herein by reference. Each connector 76 will usually comprise at least ten terminals 75. Each terminal 75 has a shoulder 82 for engagement by an individual one of the insertion plates 66.

Figure 5:
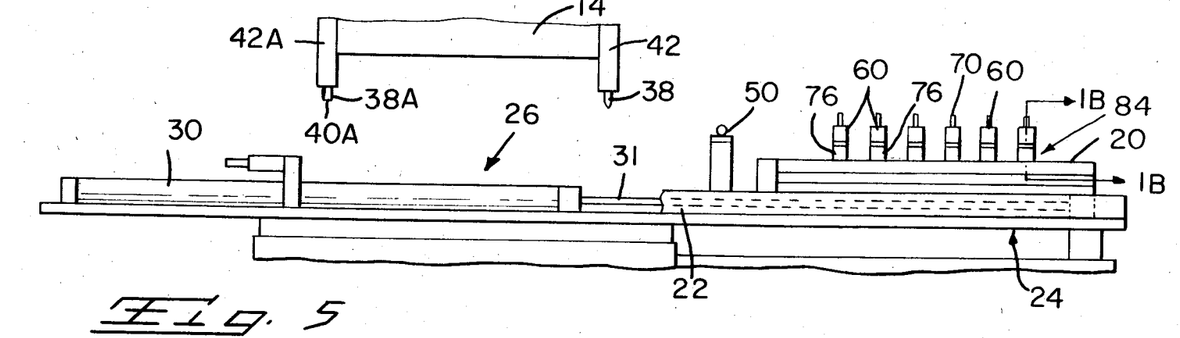
FIGS. 5 to 8 are diagrams illustrating successive stages in a cycle of operation of the press.

In order to set up the press, a dummy workpiece 84 (best seen in FIGS. 1B and 5) is first prepared. The dummy workpiece 84 is in the form of a dummy circuit board 86 to which connectors 76 have been fixed, in a predetermined array and with predetermined spacing therebetween, by force-fitting the mounting portions 80 of the terminals 75 of the connectors 76 into predrilled holes in the circuit board 86 as shown in FIG. 1B. The circuit board 86 is then loaded onto the surface 32 of shuttle 20 with the aid of board locating pins 88 (FIGS. 3 and 4) projecting from the surface 32, which are passed through corresponding holes in the board 86, the shuttle 20 being positioned at the loading station 24 and the chuck 14 being in its raised position (see FIG. 5). A tool 60 is finally removably mounted on each connector 76. To this end, the insertion plates 66 of the tool 60 are inserted into the connector 76 until their free ends engage the shoulders 82 of the terminals 75 as shown in FIG. 1B. Those parts of the pins 74 which extend below the board 86 project into the slots 34 or holes 34A in the shuttle 20.

In order to initiate a cycle of operation of the press, the tool setter presses a START button on a control console 100 (FIG. 1) of the press. The unit 30 is thereby actuated to withdraw its piston rod 31 so that the shuttle 20 is driven from its loading position at the station 24, to work station 26 along the rails 22, thereby actuating the vane switching 58 so that the piston rod 10 of the hydraulic unit 8 is first advanced to drive the platen 12 through a return stroke, along the columns and is then retracted to drive it through a return stroke, along the columns 4. At this time the photoelectric cell 50 is in an inactive state. At the end of the working stroke of the platen 12, the chuck 14 engages the plates 64 of the tools 60 which are thereby magnetically secured to the chuck 14 which had previously been magnetized. During the working stroke of the platen 12, the chuck 14 depresses the rods 70 of the tools 60 against the action of the springs 72 and the tapered free ends 40 of the pins 38 on the chuck 14 cooperate with the correspondingly tapered walls of the openings 36 in the shuttle 20 laterally to align it with respect to the chuck 14, the pins 38 being depressed into the cylinders 42 against the action of the springs 44. The springs 48 allow limited relative lateral movement between the shuttle 20 and the chuck. The pins 38A serve, by way of their flats 40A to hold down diagonally opposite corners of the shuttle 20, the bolster 47 receiving the full force of platen 12.

Figure 1C:
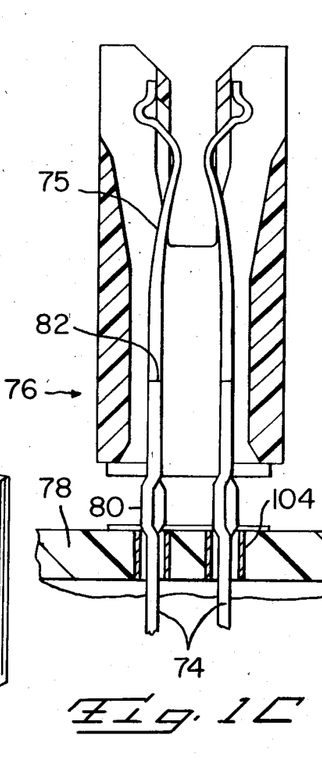
Figure 6:
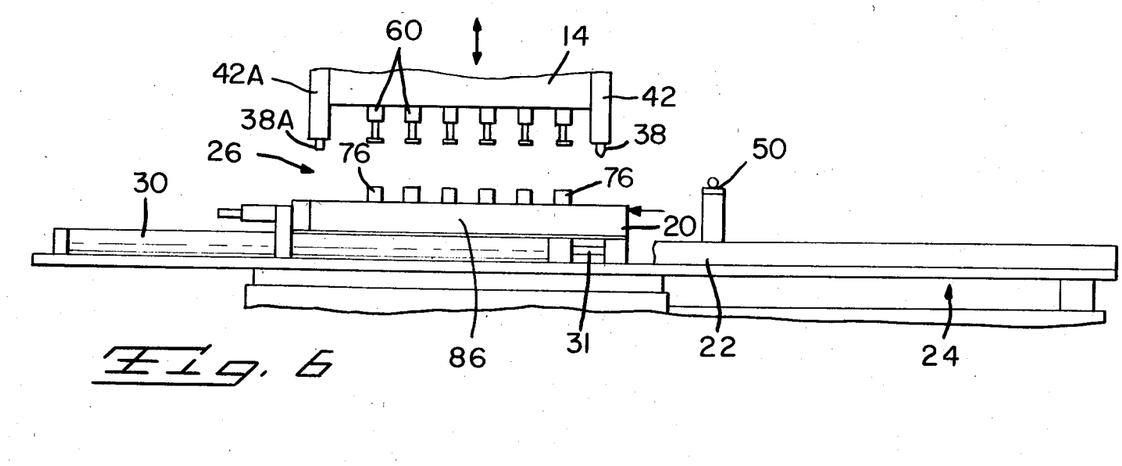

As the platen 12 is driven through its return stroke, the springs 72 of the tools 60 act upon the slides 68 thereof to withdraw the insertion plates 66 from the connectors. As shown in FIG. 6, the tools 60 are raised with the chuck 14, being disposed on the surface 16 thereof in said predetermined array and with said predetermined spacing. When the platen 12 has reached its top dead center position, a sensor (not shown) associates with the circuit of the control console 100 causes the unit 30 to be actuated to advance its piston rod 31 so that the shuttle 20 is returned from its working position to stop at its loading position upon the shuttle actuating the vane switch 54. The dummy board 84 is then removed from the shuttle 20 and is replaced by an actual workpiece in the form of the circuit board 78 (see FIG. 7), upon which, as best seen in FIG. 1C, connectors 76 have been positioned with their pins 74 inserted into holes 104 in the board 78 with the mounting portions 80 of the pins 74 resting at the mouths of the holes 104. The connectors 76 are positioned on the board 78 in exactly the same way as the connectors 76 were positioned on the dummy board 86, that is to say in said predetermined array and with said predetermined spacing.

Figure 7:
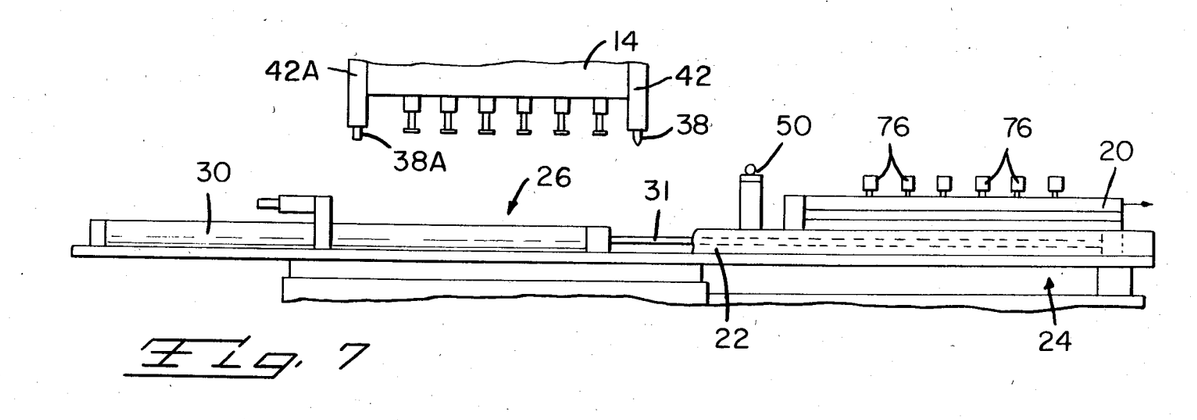
Figure 8:
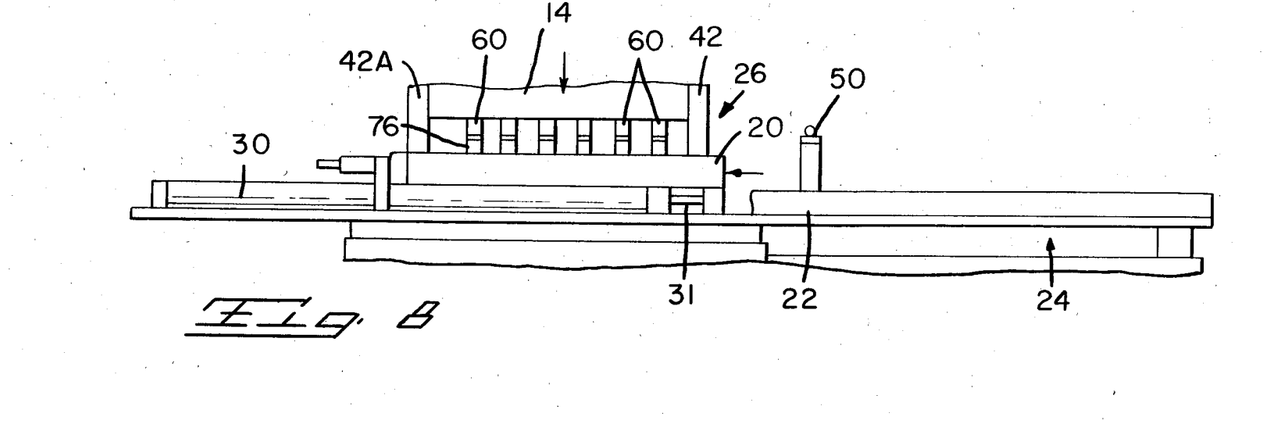

With the parts positioned as shown in FIG. 7, the operator presses a START button on an operator's console 101 on the base 2 to actuate the press for automatic operation, so that the shuttle 20 is again moved from the loading station 24 to the work station 26 and the platen 12 is driven through a working and return stroke. During the working stroke, the insertion plates 66 of the tools 60 on the chuck 14 enter the connectors on the board 78 and engage the shoulders 82 of the terminals 75 thereof so as to force-fit the portions 80 of the terminals 75 into the holes 104 (FIG. 8). As the chuck 14 rises carrying the tools 60 with it, the springs 72 of the tools 60 act upon the slides 68 to withdraw the tools 66 from the connectors. When the platen 12 reaches its top dead center position, the sensor again actuates the unit 30 to return the shuttle 20 to the loading station 24, at which the board 78, i.e., the actual workpiece, with the connectors force-fitted thereto, is removed from the shuttle 20 and is replaced by a further board 78.

Under automatic operation of the press, the photoelectric cell 50 is in an active condition. If the beam from the light source 52 is interrupted, by a connector 76 on the board 78, which, for example as a result of faulty assembly, is proud of its correct level, the press is stopped and a signal indicating the fault is displayed by the console 101.

When the production run has been completed, the press may be retooled for a further production run by removing the tools 60 from the chuck 14, after demagnetizing it, and by employing a further dummy workpiece differently to retool the chuck 14.

Figure 8A:
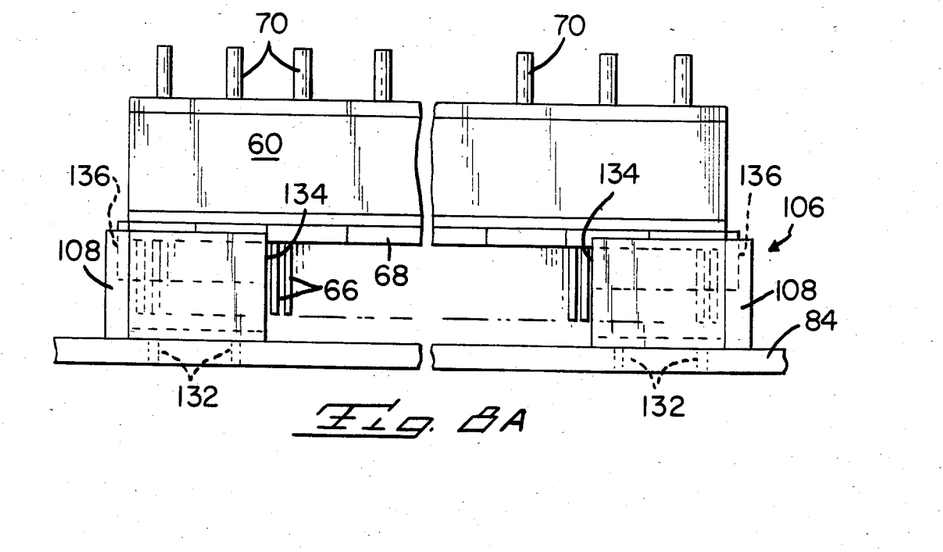
FIG. 8A is a side view of a two-part tool support according to a modification of the invention, surmounted by a component insertion tool.
Figure 9:
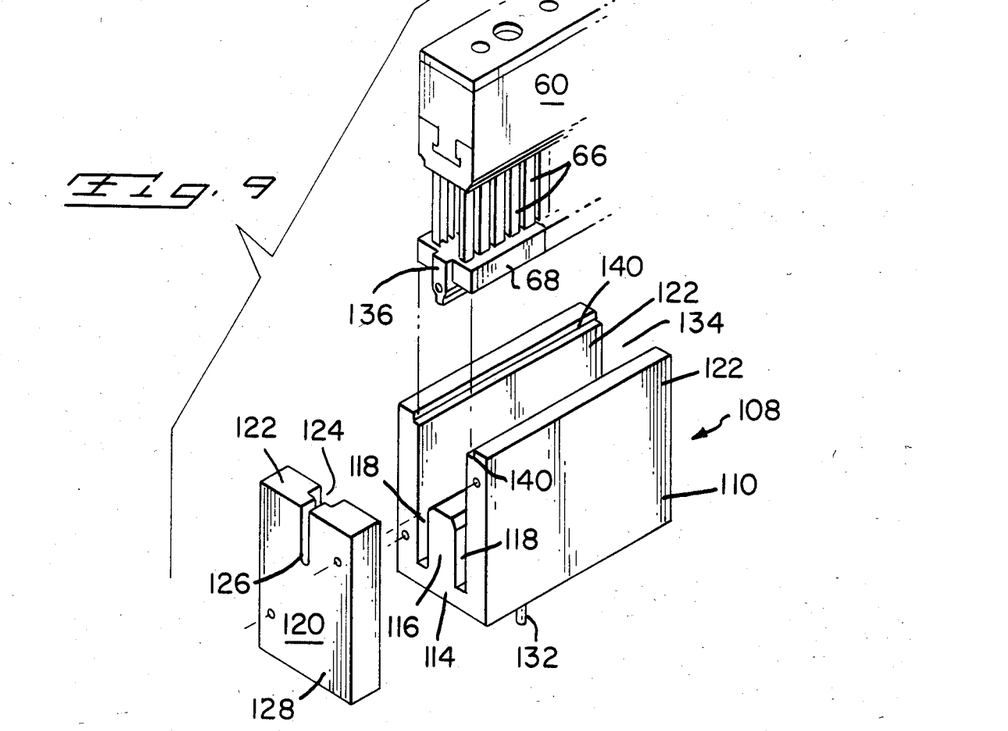
FIG. 9 is a perspective exploded view showing details of FIG. 8.

For improved accuracy in positioning the tools 60 in relation to the dummy circuit board, tool supports 106 according to FIGS. 8A and 9 may be used, instead of tool supports in the form of connectors, for holding the tools 60.

Each tool support 106 (only one of which is shown) comprises two parts 108. As best seen in FIG. 9, each part 108 comprises a channel section 110 having side walls 112 and a base 114 from which upstands a central rib 116 defining, in cooperation with the walls 112, insertion plate receiving grooves 118. An end plate 120 closes one end of the channel section 110. The plate 120 has extending from its upper (as seen in FIG. 9) face 122, a notch 124, communicating with a slot 126 which also extends from the face 122, and opens into the outer surface 128 of the plate 120. On the outer surface 130 of the base 114 are mounting spigots 132.

When the dummy workpiece is being prepared, the spigots 132 are forced into pre-drilled holes in the board 84, thereby to mount the parts 108 thereon in axially spaced relationship so that their open ends 134 face one another as shown in FIG. 8A.

A tool 60 is then inserted into each two-part support 106, so that the guide or slide 68 engages the ribs 116, being thereby raised to abut the tool body 62, so that the insertion plates 66 extend into the grooves 118, projections 136 are received in the slots 126. The longitudinal edges of the guide 68 are received in longitudinal grooves 140 in the upper faces 142 of the walls 122.

By virtue of the supports 106, the tools 60 are firmly located with respect to the board 84, on three orthogonal axes, but are readily removed therefrom as the magnetic chuck 14 rises.

What is claimed is:

1. A method of force-fitting components into a workpiece, the method comprising the steps of:

locating in alignment with a magnetic chuck on a press platen, a dummy workpiece having tool supports fixed thereto in a predetermined array with predetermined spacing therebetween and with a component insertion tool surmounting each tool support;

moving the platen towards the workpiece to secure each tool magnetically to the chuck;

withdrawing the platen thereby to remove each tool from the tool support surmounted thereby;

replacing the dummy workpiece by an actual workpiece with components arranged thereon in said predetermined array and with said predetermined spacing therebetween; and moving the platen towards the dummy workpiece to cause each tool on the chuck to force-fit the corresponding component into the actual workpiece.

2. A method of force-fitting pins having enlarged mounting portions and projecting from electrical connectors, into holes in a circuit board, the method comprising the steps of:

locating in alignment with a magnetic chuck on a press platen, a dummy circuit board having electrical connectors fixed thereto in a predetermined array with predetermined spacing therebetween and with pin insertion plates of a pin insertion tool surmounting each connector, engaging a seat on each pin thereof;

moving the platen towards the dummy circuit board to secure each tool magnetically to the chuck;

withdrawing the platen thereby to remove the pin insertion plates of the tools from the connectors;

replacing the dummy circuit board by an actual circuit board with connectors identical of those of the dummy circuit board arranged on the actual circuit board in said predetermined array and with said predetermined spacing therebetween, the mounting portion of each of the connectors resting at the mouth of a hole in the actual circuit board on a side thereof facing the chuck; and moving the platen towards the actual circuit board to cause the pin insertion plate of each tool on the chuck to engage the shoulder of the corresponding terminal of the corresponding connector on the actual circuit board thereby to force-fit said pin into the corresponding hole in the actual circuit board.

3. A method according to claim 2, in which the pin insertion plates of the tools are inserted into the connectors of the dummy circuit board at a loading position remote from the chuck after which the dummy circuit board is moved into a working position in register with the chuck.

4. A hydraulic press comprising a base; a press platen mounted above the base; a chuck on the platen; a flat magnetic tool supporting surface on the chuck and facing the base; a worktable slidably mounted on the base for movement between a work station and a loading station thereon; a flat, workpiece supporting surface on the worktable; means on the base supporting the platen for reciprocating movement towards and away from the base with said tool supporting surface and said workpiece supporting surface in parallel relationship; a hydraulic ram mounted on said supporting means and connected to the platen, for driving the platen through a working stroke towards the base and a return stroke away therefrom; means on the base and connected to the worktable for driving the worktable between said work station at which said workpiece supporting surface faces said tool supporting surface and said loading station which is laterally displaced from the platen; and cooperating means on the platen and the work table for automatically laterally aligning said workpiece supporting surface with said tool supporting surface during the working stroke of the platen when the worktable is at the work station.

5. A press according to claim 4, in which the chuck comprises a permanent electromagnet.

6. A press according to claim 4, in which the worktable is in the form of a shuttle having means for locating a circuit board thereon, the shuttle being drivable along a rectilinear path between said work station and said loading station, a light source and a photoelectric cell being positioned on opposite sides of said path between said work station and said loading station at a predetermined level above said workpiece supporting surface.

7. A press according to claim 4, in which the aligning means comprise spring loaded pins extending from the chuck towards the base, each pin having a tapered free end portion for cooperation with a correspondingly tapered opening in the worktable, the worktable being spring loaded to allow limited relative lateral movement between the worktable and the chuck.

8. A press according to claim 4, in which a first limit switch is provided on said base for actuating said ram to cause the platen to carry out a working and a return stroke upon the worktable being positioned at the work station, a second limit switch being provided on said worktable to deactuate the worktable driving means, upon the worktable being positioned at the loading station.

9. A press according to claim 4, in which there is mounted on the worktable, a dummy workpiece to which are fixed a plurality of tool supports, each surmounted by a tool having a magnetically attractable surface which faces said tool supporting surface, when the worktable is at the work station, each tool having insertion fingers projecting therefrom for force-fitting a component into the actual workpiece, when such is disposed on the worktable in place of the dummy workpiece and the worktable is at the work station.

10. A press according to claim 9, in which each tool support comprises a pair of tool receiving channel sections, fixed to the dummy workpiece in axial alignment, said channel sections opening in a direction away from the worktable and having internal grooves for receiving said fingers of said tool and end portions of said tool for firmly locating it with respect to the dummy workpiece, on three orthogonal axes.

* * * * *